US010418462B2

(12) United States Patent
Anderson et al.

(10) Patent No.: US 10,418,462 B2
(45) Date of Patent: Sep. 17, 2019

(54) SILICIDATION OF BOTTOM SOURCE/DRAIN SHEET USING PINCH-OFF SACRIFICIAL SPACER PROCESS

(71) Applicant: International Business Machines Corporation, Armonk, NY (US)

(72) Inventors: Brent A. Anderson, Jericho, VT (US); Huiming Bu, Glenmont, NY (US); Terence B. Hook, Jericho, VT (US); Fee Li Lie, Albany, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/716,719

(22) Filed: Sep. 27, 2017

(65) Prior Publication Data

US 2018/0019323 A1    Jan. 18, 2018

Related U.S. Application Data

(62) Division of application No. 15/189,073, filed on Jun. 22, 2016, now Pat. No. 9,853,127.

(51) Int. Cl.
*H01L 29/45* (2006.01)
*H01L 29/66* (2006.01)
(Continued)

(52) U.S. Cl.
CPC ............ *H01L 29/66666* (2013.01); *H01L 21/823425* (2013.01); *H01L 29/456* (2013.01);
(Continued)

(58) Field of Classification Search
CPC ....... H01L 29/66666; H01L 21/823425; H01L 29/456; H01L 29/6653; H01L 29/7827
See application file for complete search history.

(56) References Cited

U.S. PATENT DOCUMENTS 5,128,272 A   7/1992  Ramde
5,326,711 A   7/1994  Malhi
(Continued)

FOREIGN PATENT DOCUMENTS

CA       1271266       7/1990
WO    2002086904      10/2002
(Continued)

OTHER PUBLICATIONS

Choi, Y., et al., "A Spacer Patterning Technology for Nanoscale CMOS", IEEE Transactions on Electron Devices, Mar. 2002, pp. 1-6, vol. 49, No. 3.
(Continued)

*Primary Examiner* — Long K Tran
(74) *Attorney, Agent, or Firm* — Fleit Gibbons Gutman Bongini Bianco PL; Thomas S. Grzesik

(57) ABSTRACT

A vertical fin field-effect-transistor and a method for fabricating the same. The vertical fin field-effect-transistor includes at least a substrate, a first source/drain layer, and a plurality of fins each disposed on and in contact with the first source/drain layer. Silicide regions are disposed within a portion of the first source/drain layer. A gate structure is in contact with the plurality of fins, and a second source/drain layer is disposed on the gate structure. The method includes forming silicide in a portion of a first source/drain layer. A first spacer layer is formed in contact with at least the silicide, the first source/drain layer and the plurality of fins. A gate structure is formed in contact with the plurality of fins and the first spacer layer. A second spacer layer is formed in contact with the gate structure and the plurality of fins.

20 Claims, 15 Drawing Sheets

(51) Int. Cl.
*H01L 21/8234* (2006.01)
*H01L 29/78* (2006.01)
*H01L 29/08* (2006.01)

(52) U.S. Cl.
CPC ...... *H01L 29/6653* (2013.01); *H01L 29/7827* (2013.01); *H01L 29/0847* (2013.01)

(56) References Cited

U.S. PATENT DOCUMENTS

| | | | |
|---|---|---|---|
| 6,104,061 | A | 8/2000 | Forbes et al. |
| 6,150,210 | A | 11/2000 | Arnold |
| 6,194,773 | B1 | 2/2001 | Malhi |
| 7,205,609 | B2 | 4/2007 | Lee et al. |
| 7,300,837 | B2 | 11/2007 | Chen et al. |
| 7,422,950 | B2 | 9/2008 | Curello et al. |
| 7,560,728 | B2 | 7/2009 | Lin et al. |
| 7,791,068 | B2 | 9/2010 | Meng et al. |
| 8,383,477 | B2 | 2/2013 | Lee |
| 8,471,310 | B2 | 6/2013 | Hynecek |
| 8,524,592 | B1 | 9/2013 | Xie et al. |
| 8,969,965 | B2 | 3/2015 | Chang et al. |
| 9,048,329 | B2 | 6/2015 | Kim et al. |
| 9,245,885 | B1 * | 1/2016 | Xie .................... H01L 27/0886 |
| 2003/0015755 | A1 | 1/2003 | Hagemeyer |
| 2007/0148836 | A1 * | 6/2007 | Cheng ............. H01L 21/823418 |
| | | | 438/157 |
| 2008/0197397 | A1 | 8/2008 | Parthasarathy et al. |
| 2011/0006360 | A1 | 1/2011 | Ikebuchi |
| 2012/0161324 | A1 * | 6/2012 | Heinrich ........... H01L 21/28518 |
| | | | 257/757 |
| 2012/0214285 | A1 | 8/2012 | Guha et al. |
| 2013/0161744 | A1 * | 6/2013 | Basker .............. H01L 29/41791 |
| | | | 257/347 |
| 2013/0221414 | A1 | 8/2013 | Zhao et al. |
| 2014/0065775 | A1 | 3/2014 | Chien et al. |
| 2015/0048460 | A1 | 2/2015 | Lee et al. |
| 2015/0303272 | A1 | 10/2015 | Bryant et al. |
| 2015/0357432 | A1 | 12/2015 | Lin et al. |
| 2016/0111430 | A1 | 4/2016 | Liaw |

FOREIGN PATENT DOCUMENTS

| | | |
|---|---|---|
| WO | 2005091376 | 9/2005 |
| WO | 2013123287 | 8/2013 |

OTHER PUBLICATIONS

Disclosed Anonymously, "SOI FinFET Ge I/I for Contact Resistance Reduction", IP.com No. IPCOM000211612D, Oct. 13, 2011, pp. 1-7.

Disclosed Anonymously, "Segmented Stacked FinFET for Improved Contact Resistance", IP.com No. IPCOM000242086D, Jun. 18, 2015, pp. 1-2.

List of IBM Patents or Patent Applications Treated as Related.

* cited by examiner

_US 10,418,462 B2_

SILICIDATION OF BOTTOM SOURCE/DRAIN SHEET USING PINCH-OFF SACRIFICIAL SPACER PROCESS

BACKGROUND OF THE INVENTION

The present invention generally relates to the field of semiconductors, and more particularly relates to vertical field-effect-transistors having a silicided bottom source/drain.

Vertical transistors are a promising option for technology scaling for 5 nm and beyond. However, the contact has to land on the bottom source/drain to get the bottom source/drain connect to back end wiring. The distance to the bottom contact area to transistor will increase the resistance. A metal silicide on top of the source/drain can help mitigate this resistance penalty. However, the silicidation process is very difficult for the area between fins due to the tight fin pitch and results in metal sticking between fins, which causes defect or device variation.

SUMMARY OF THE INVENTION

In one embodiment, a method for fabricating a vertical fin field-effect-transistor is provided. The method includes forming a structure comprising a substrate, a source/drain layer, isolation regions, and a plurality of fins disposed on and in contact with first source/drain layer. Silicide is formed in a portion of the first source/drain layer. A first spacer layer is formed in contact with at least the silicide, the first source/drain layer and the plurality of fins. A gate structure is formed in contact with the plurality of fins and the first spacer layer. A second spacer layer is formed in contact with the gate structure and the plurality of fins. A second source/drain layer is formed in contact with second spacer layer and the plurality of fins.

In another embodiment, a vertical fin field-effect-transistor is provided. The vertical fin field-effect-transistor includes at least a substrate, a first source/drain layer, and a plurality of fins each disposed on and in contact with the first source/drain layer. Silicide regions are disposed within a portion of the first source/drain layer. A gate structure is in contact with the plurality of fins, and a second source/drain layer is disposed on the gate structure.

In yet another embodiment, an integrated circuit is provided. The integrated circuit includes a vertical fin field-effect-transistor. The vertical field-effect-transistor includes at least a substrate, a first source/drain layer, and a plurality of fins each disposed on and in contact with the first source/drain layer. Silicide regions are disposed within a portion of the first source/drain layer. A gate structure is in contact with the plurality of fins, and a second source/drain layer is disposed on the gate structure.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
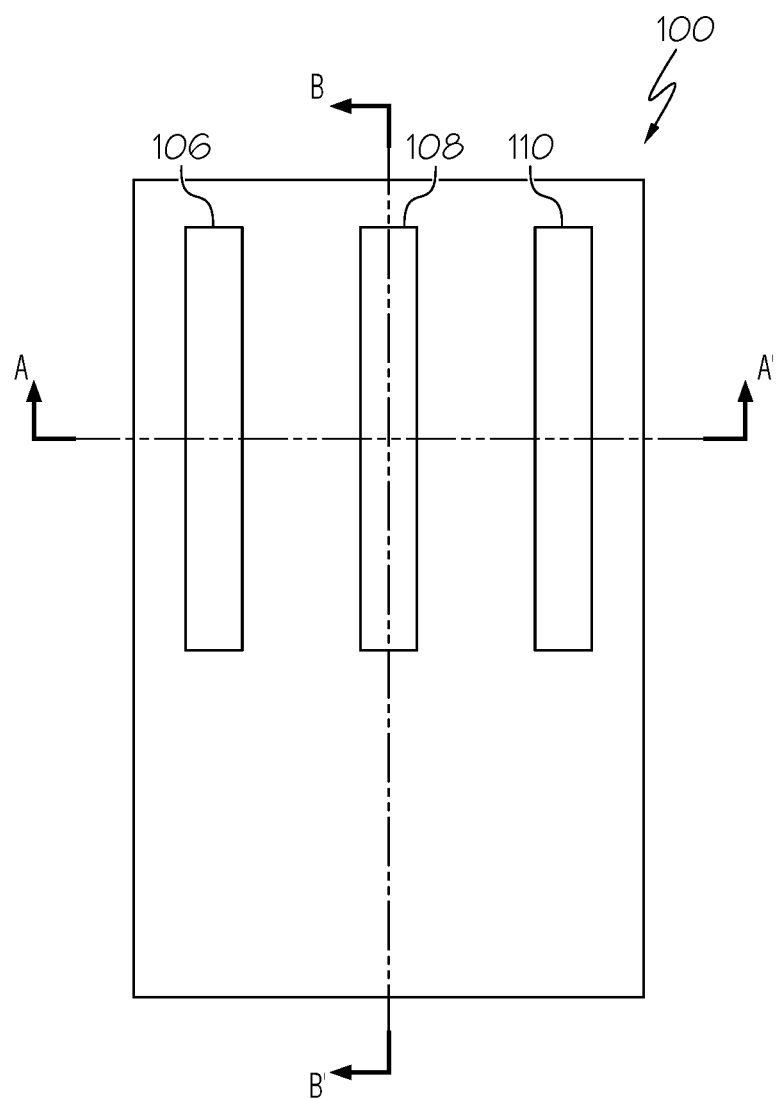
FIG. 1 is a top-down view of an initial semiconductor structure according to one embodiment of the present invention

It is to be understood that the present invention will be described in terms of a given illustrative architecture; however, other architectures, structures, substrate materials and process features and steps can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-13 illustrate various processes for fabricating vertical field-effect-transistors (FETs) with a silicided bottom source/drain. In general, the figures include various cross-sectional views that are taken where indicated in the plain view shown in FIG. 1. More specifically, the view "A" is taken along a line that passes through a fin, while view "B" is a cross-section view that is taken transverse to the long axis of a fin.

Figure 1A:
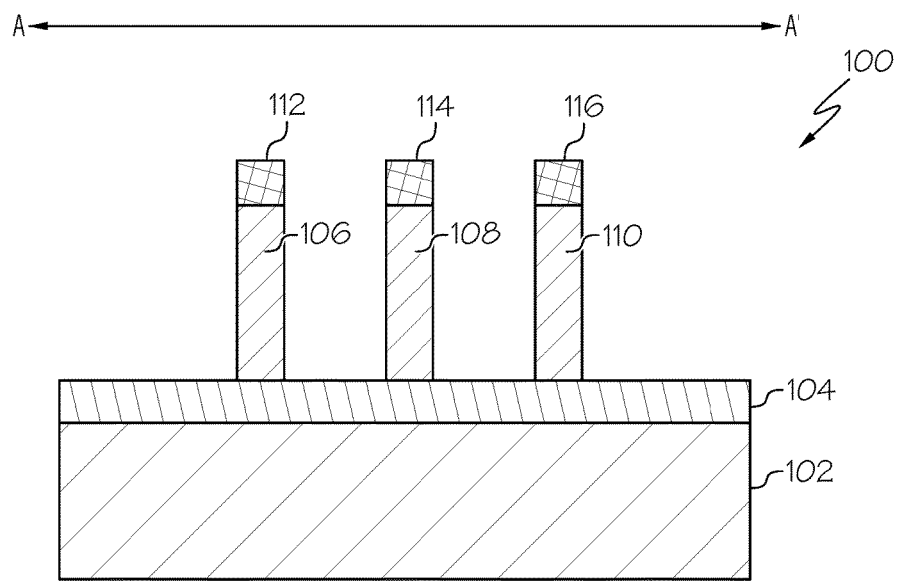
FIGS. 1A and 1B are a cross-sectional views of an initial semiconductor structure according to one embodiment of the present invention.
Figure 1B:
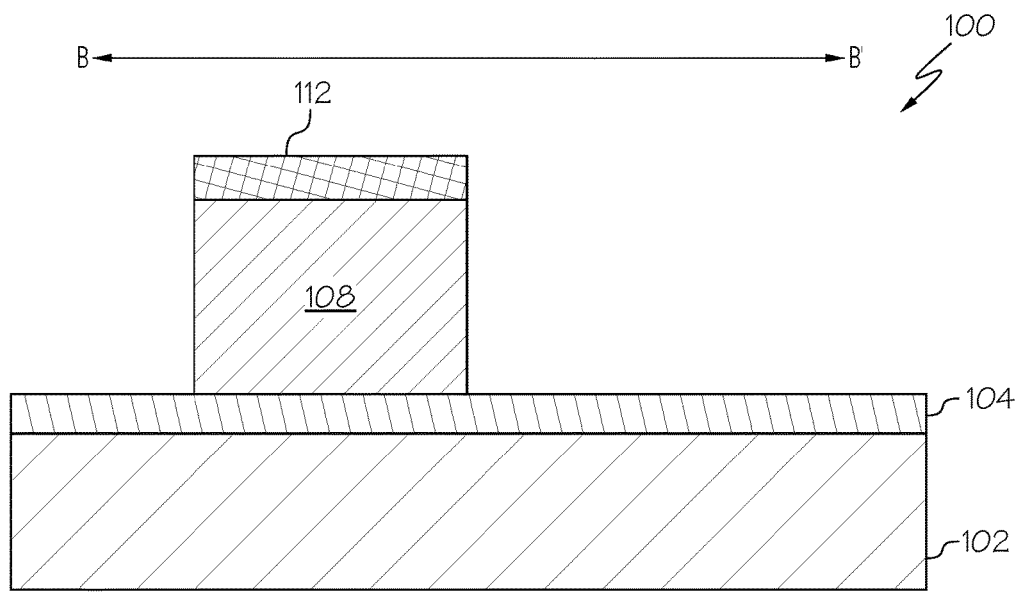

FIGS. 1A and 1B show a partial semiconductor structure 100 comprising a substrate 102, a bottom source/drain layer 104, a plurality of fins structures 106, 108, 110, and an etch-stop cap 112, 114, 116 in contact with a top surface of each fin 106, 108, 110. The substrate 102, in one embodiment, is single crystalline and or a bulk substrate, a semiconductor-on-insulator (SOI) substrate, or a hybrid substrate. An optional insulator layer (not shown) including a dielectric material such as silicon oxide, silicon nitride, silicon oxynitride, or any combination thereof, in one embodiment, is be formed on an in contact with the substrate 102. The thickness of the substrate 102 can be, for example, from 50 microns to 1,000 microns, although lesser and greater thicknesses can be employed as well.

The substrate 102, in one embodiment, is appropriately doped either with p-type dopant atoms and/or with n-type dopant atoms, or the material can be substantially undoped (intrinsic). The dopant concentration of the substrate 102, in one example, is from $1.0 \times 10^{15}/cm^3$ to $1.0 \times 10^{19}/cm^3$, and in one embodiment, is from $1.0 \times 10^{16}\ cm^3$ to $3.0 \times 10^{18}/cm^3$, although lesser and greater dopant concentrations are applicable as well. In one example, an optional counter-doped layer (not shown) is formed on and in contact with the substrate 102 (or buried insulator layer if formed). The counter-doped layer, in one embodiment, is formed by an epitaxial growth of a semiconductor material. The counter-doped layer can be implanted with dopants and annealed using, for example, rapid thermal anneal. Alternatively, the counter-doped layer is doped in-situ during the epitaxial growth. The purpose of the counter-doped layer is to provide isolation between one transistor and the next transistor.

FIGS. 1A and 1B further show that, in one embodiment, a bottom source/drain layer 104 is disposed on and in contact with the substrate 102 (or counter-doped layer if formed). The bottom source/drain layer 104, in one embodiment, is an n++ doped region or a p++ doped region of the substrate 102 and has a thickness in a range of, for example, about 10 nm to about 200 nm. However, other thicknesses are applicable as well. The bottom source/drain region 104 is formed, in one embodiment, by epitaxial growth. The channel layer 106 is disposed on and in contact with the bottom source/drain layer 104. The channel layer 106 includes a channel material that can be undoped or doped with either p-type or n-type dopants through ion implantation, plasma doping, or gas phase doping. P-type doping is produced by doping the channel material with elements from group III of the periodic table (e.g., boron, aluminum, gallium, or indium). As an example, the dopant is boron in a concentration ranging from 1×10E17 atoms/cm3 to 1×10E22 atoms/cm3. N-type doping is produced by doping the channel material with elements from group V of the periodic table (e.g., phosphorus, antimony, or arsenic). As an example, the dopant is phosphorus in a concentration ranging from 1×10E14 atoms/cm3 to 1×10E20 atoms/cm3. The channel layer 106 is formed, in one embodiment, by epitaxial growth.

The terms "epitaxial growth", "epitaxial deposition", "epitaxially formed", epitaxially grown", and their variants and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in one or more embodiments 104 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof. While an epitaxial silicon germanium alloy fin can be formed utilizing a combination of such gas sources. Carrier gases like hydrogen, nitrogen, helium and argon can be used.

The fins 106, 108, 110 are formed, in one embodiment, by forming an etch-stop capping layer onto a channel material through, for example, deposition. The etch-stop capping layer, in one embodiment, is made of silicon-nitride although other material suitable in providing etch-stop function can be used as well. The fin structures 106, 108, 110 and their etch-stop caps 112, 114, 116, are subsequently formed or etched out of the channel material to be on top of and in contact with the bottom source/drain layer 104 through a process involving masking, using industry-standard lithographic techniques, and directionally etching the etch-stop capping layer and underneath channel material.

Figure 2A:
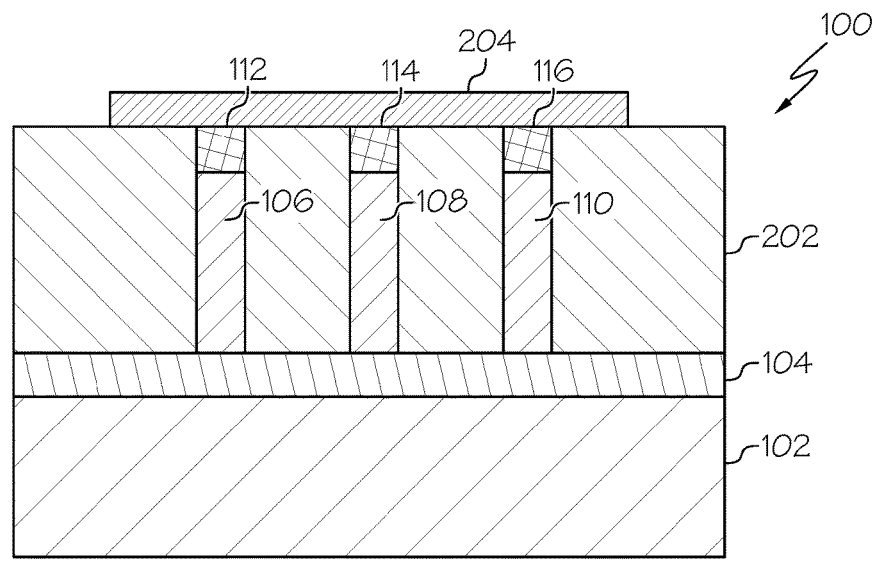
FIGS. 2A and 2B are cross-sectional views of the semiconductor structure after fin structures have been formed according to one embodiment of the present invention.
Figure 2B:
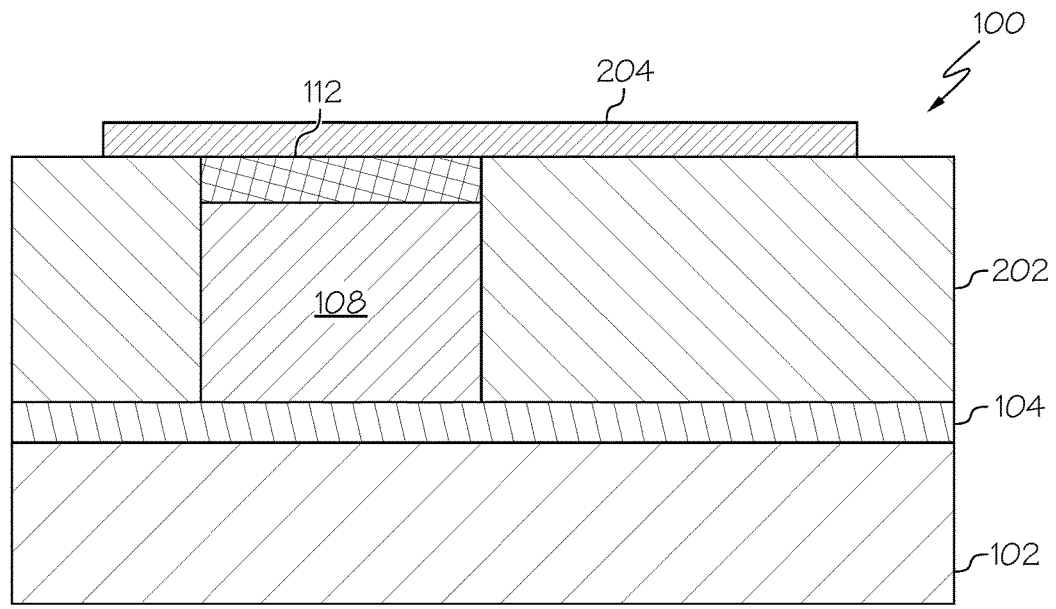
Figure 3A:
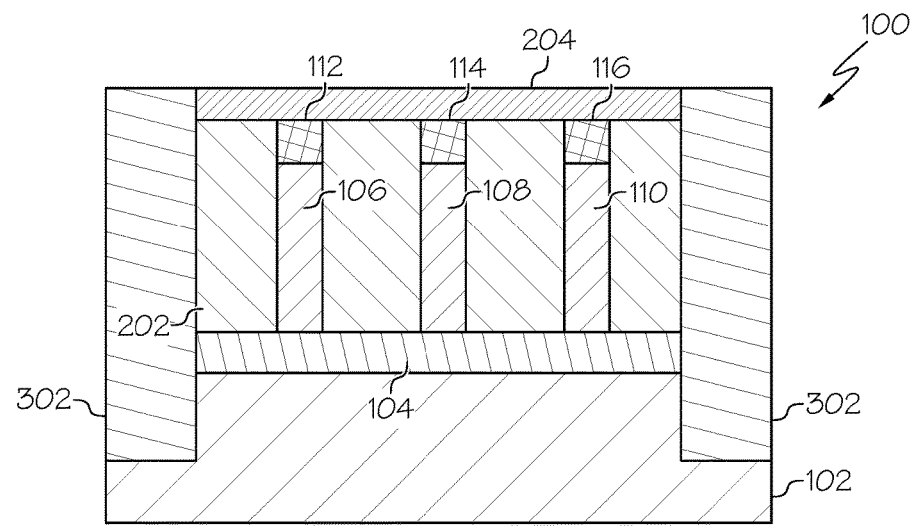
FIGS. 3A and 3B are cross-sectional views of the semiconductor structure after exposed portions of the structure have been etched and isolation oxide has been deposited according to one embodiment of the present invention.
Figure 3B:
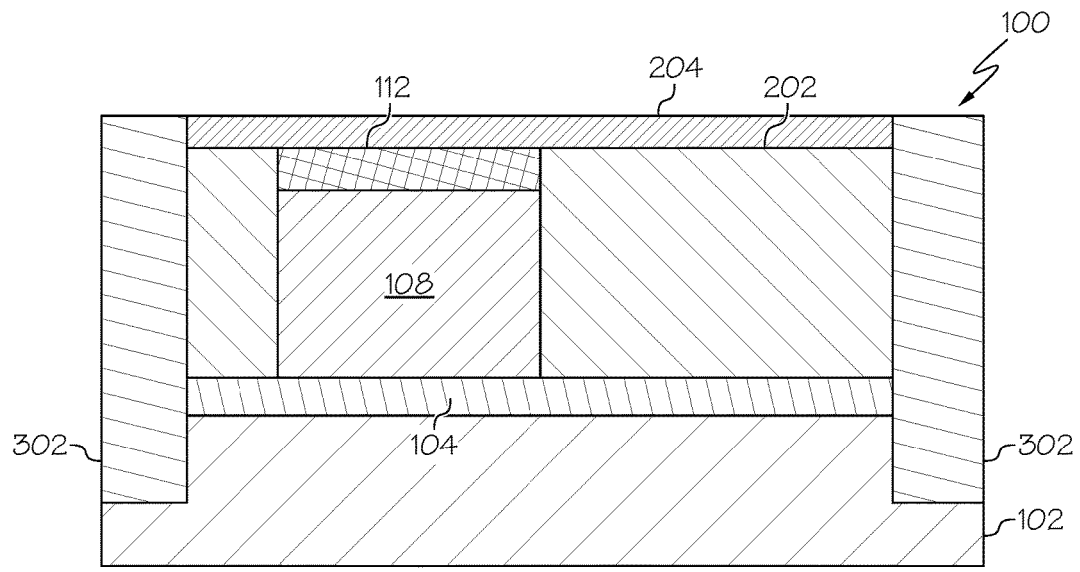
Figure 4A:
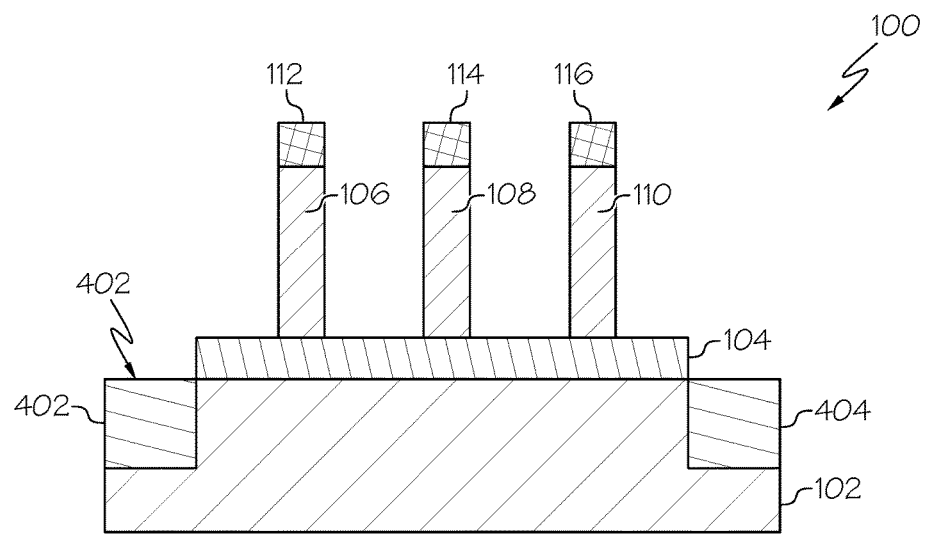
FIGS. 4A and 4B are cross-sectional views of the semiconductor structure after isolation regions have been formed according to one embodiment of the present invention.
Figure 4B:
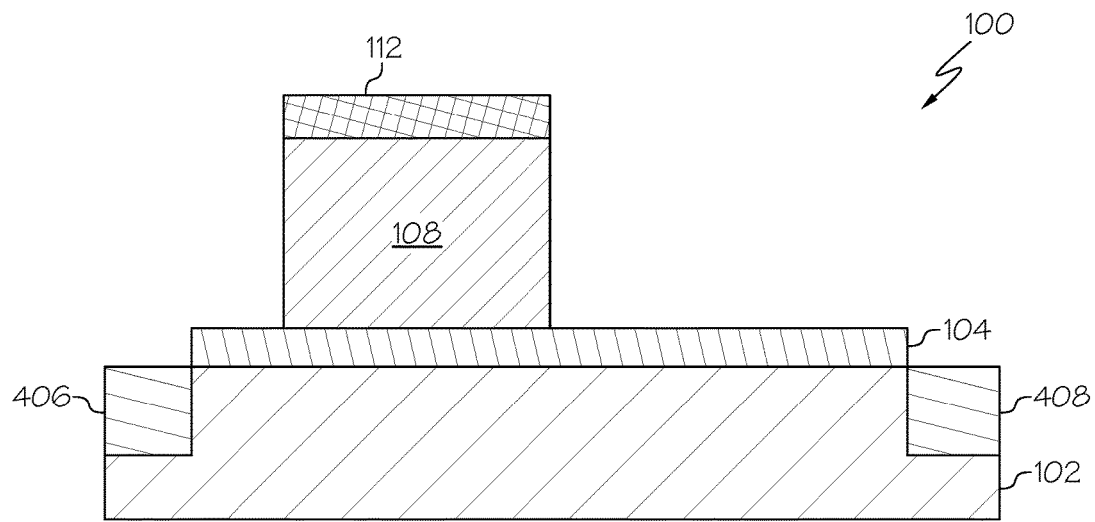

After the fins 106, 108, 110 are formed, a flowable oxide 202 is deposited over the structure 100 as shown in FIGS. 2A and 2B. FIGS. 2A and 2B also show that a hard mask 204 is formed over the structure 100 leaving exposed portions where shallow trench isolation (STI) regions are to be formed. The hard mask 204, in one embodiment, is formed by depositing, and a suitable hard mask material, such as silicon nitride, onto the flowable oxide 202 and then patterned using standard lithography and etching techniques. Trenches are then formed within the exposed oxide 202 down into the substrate 102. Shallow trench isolation (STI) oxide is then deposited within the trench regions, as shown in FIG. 3. The flowable oxide 202, mask 204, and excess STI oxide are removed via chemical-mechanical polishing (CMP), selective etching, and/or the like. FIG. 4 shows that the resulting STI regions 402, 404, 406, 408 include a top surface 410 that is co-planar with a top surface 412 of the substrate 102.

Figure 5A:
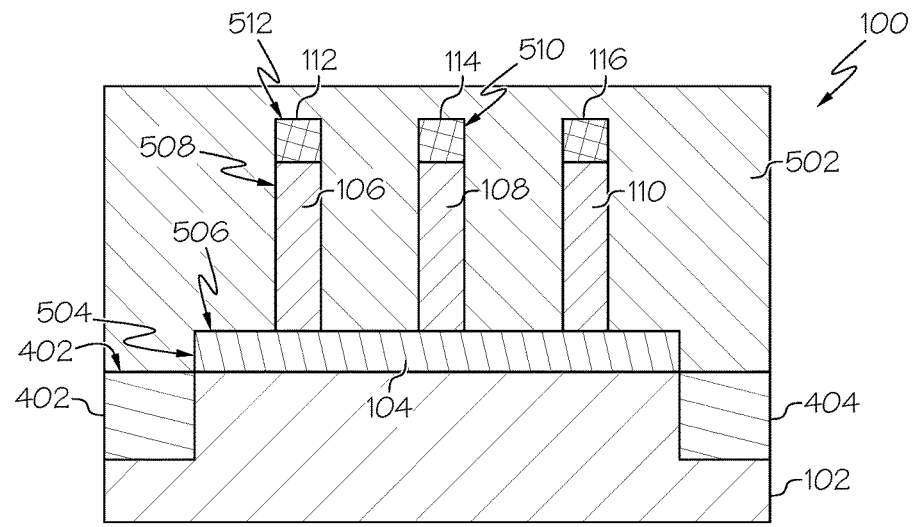
FIGS. 5A and 5B are cross-sectional views of the semiconductor structure after oxide has been formed according to one embodiment of the present invention.
Figure 5B:
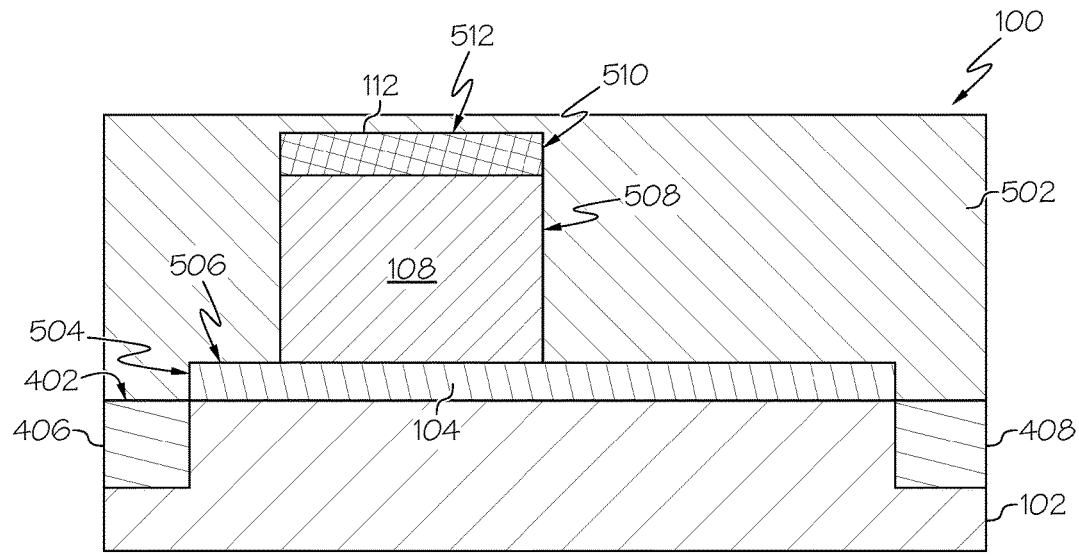

An oxide film 502 is the deposited over the entire structure 100, as shown in FIGS. 5A and 5B. The oxide film 502 contacts the top surface 410 of the STI regions 402, 404, 406, 408; the sidewalls 504 of the bottom source/drain layer 104; the top surface 506 of the bottom source/drain layer 104; the sidewalls 508 of each fin 106, 108, 110; the sidewalls 510 of the etch-stop caps 112, 114, 116; and the top surface 512 of the etch-stop caps 112, 114, 116. The oxide is thick enough (e.g., >6 nm) to pinchoff between the fins 106, 108, 110.

Figure 6A:
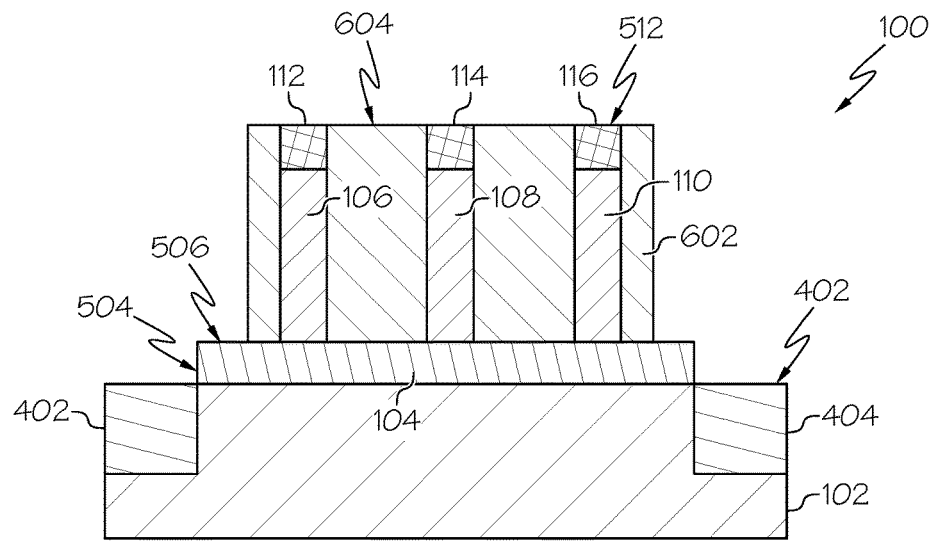
FIGS. 6A and 6B are cross-sectional views of the semiconductor structure after a sacrificial oxide layer has been formed according to one embodiment of the present invention.
Figure 6B:
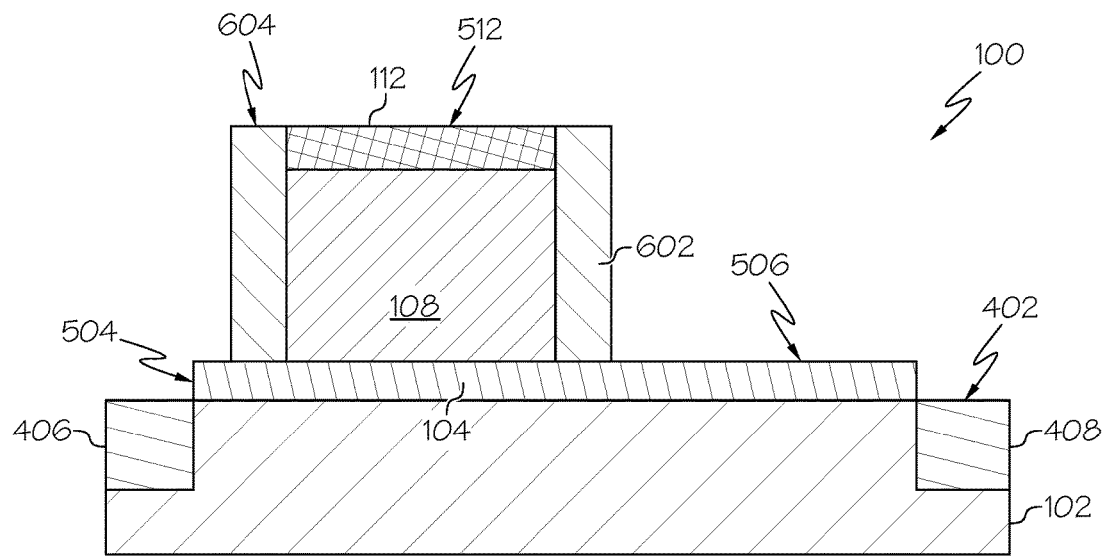

FIGS. 6A and 6B show that excess oxide is removed via a selective process such as Reactive Ion Etching (RIE) to form a sacrificial oxide spacer 602 in contact with and surrounding the fins 106, 108, 110 and in contact with a portion of the top surface 506 of the bottom source/drain layer 104. This process exposes the top surface 401 of the STI regions 402, 404, 406, 408; the sidewalls 504 of the bottom source/drain layer 104; a portion of the top surface 506 of the bottom/source drain layer 104; and the top surface 112 of the etch-stop caps 112, 114, 116. A top surface 604 of the spacer 602 is co-planar with the top surface 512 of the etch-stop caps 112, 114, 116. The sacrificial spacer 602 is self-aligned to the fins and protects the fins and area between the fins from a subsequent silicidation process.

Figure 7A:
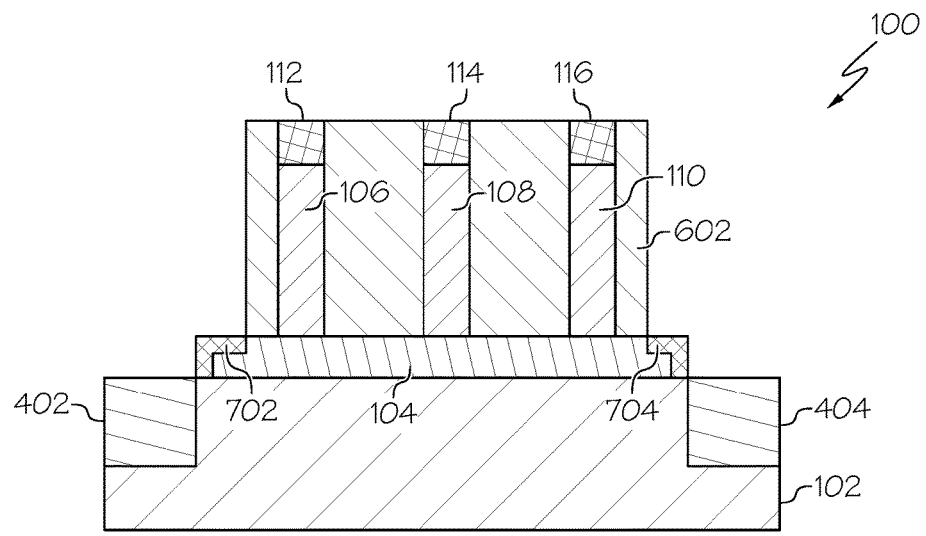
FIGS. 7A and 7B are cross-sectional views of the semiconductor structure after silicide has been formed on a bottom source/drain layer according to one embodiment of the present invention.
Figure 7B:
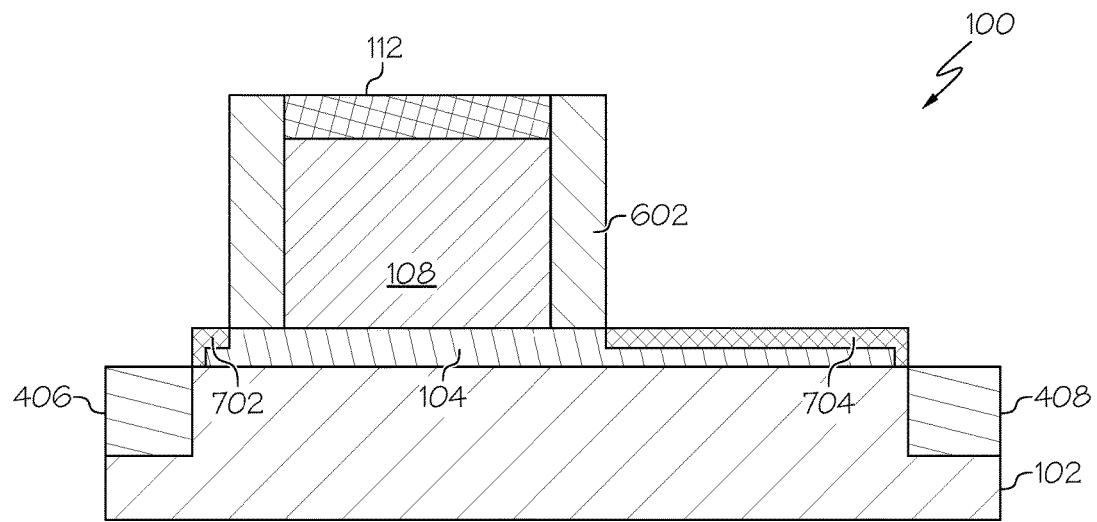
Figure 8A:
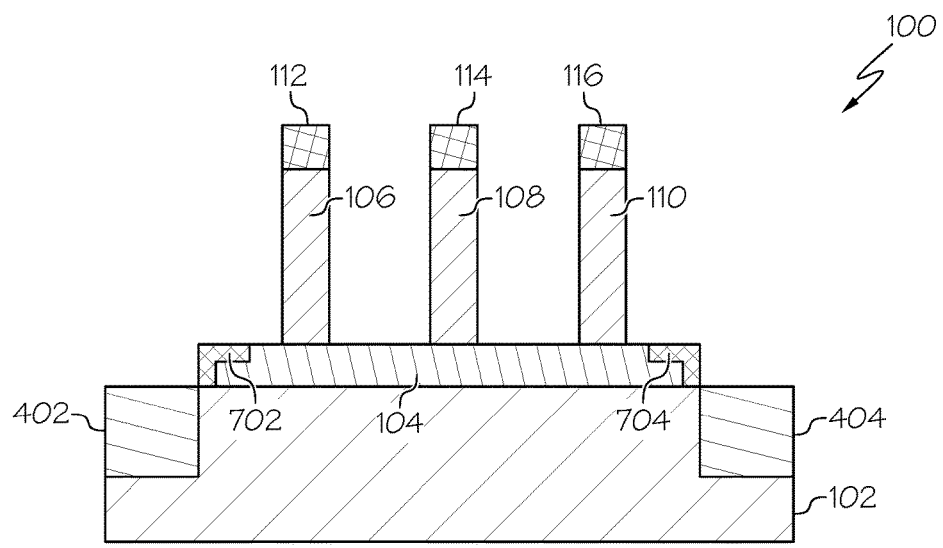
FIGS. 8A and 8B are cross-sectional views of the semiconductor structure after a bottom spacer layer has been formed according to one embodiment of the present invention.
Figure 8B:
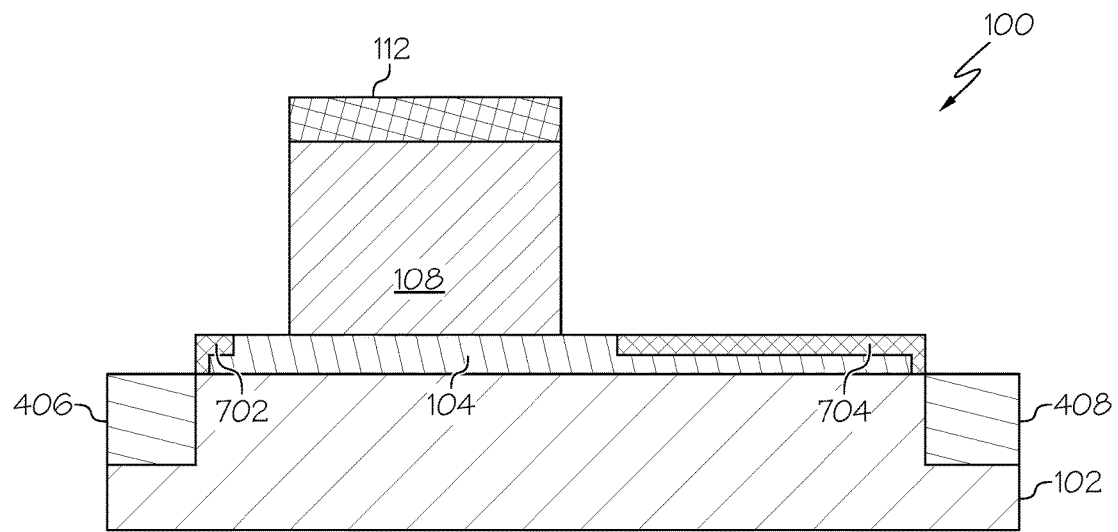

Silicide regions 702, 704 are then formed on the exposed portions of the bottom source/drain layer 104, as shown in FIGS. 7A and 7B. For example, a metal is deposited on top and in contact with the exposed portions of the bottom source/drain layer 104. An anneal is then performed to form silicide from the deposited metal and a portion of the bottom source/drain layer 104. Unreacted metal is then selectively removed. The metal, in one example, includes cobalt, tungsten, nickel, titanium, platinum, or an alloy or combination thereof. However, other materials are applicable a well. In one embodiment, the silicide regions 702, 704 extend above the top surface 506 of the bottom source/drain layer 104 and into the bottom source/drain layer 104. The silicide regions 702, 704 are not formed on the STI regions 402, 404, 406, 408. FIG. 7B further shows that silicide region 704 is adjacent to and extends beyond an end of the fins 106, 108, 110. After the silicide regions 702, 704 have been formed the spacer 602 is removed via chemical-mechanical polishing (CMP), selective etching, and/or the like, as shown in FIGS. 8A and 8B. The silicided area provides high selectivity for contact opening (RIE), less gouging due to contact over etching.

Figure 9A:
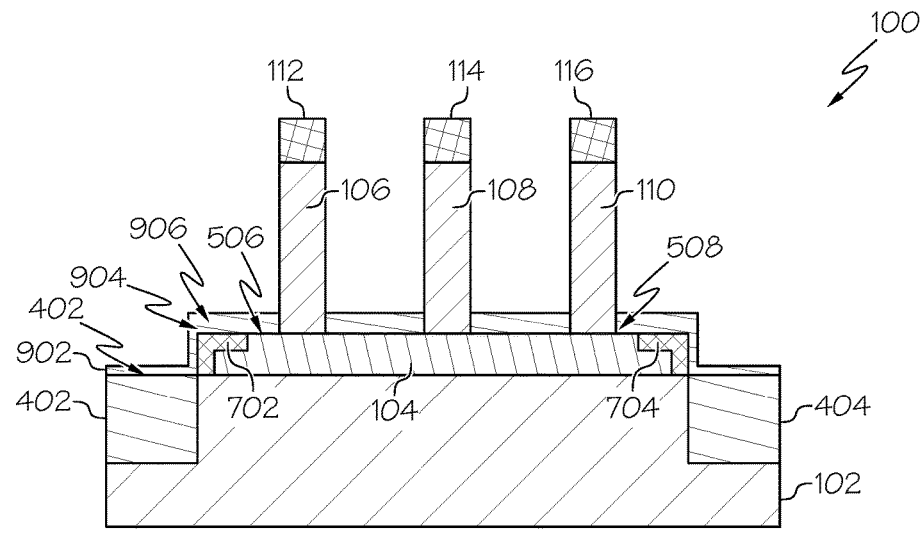
FIGS. 9A and 9B are cross-sectional views of the semiconductor structure after a dielectric layer has been formed on the fins according to one embodiment of the present invention.
Figure 9B:
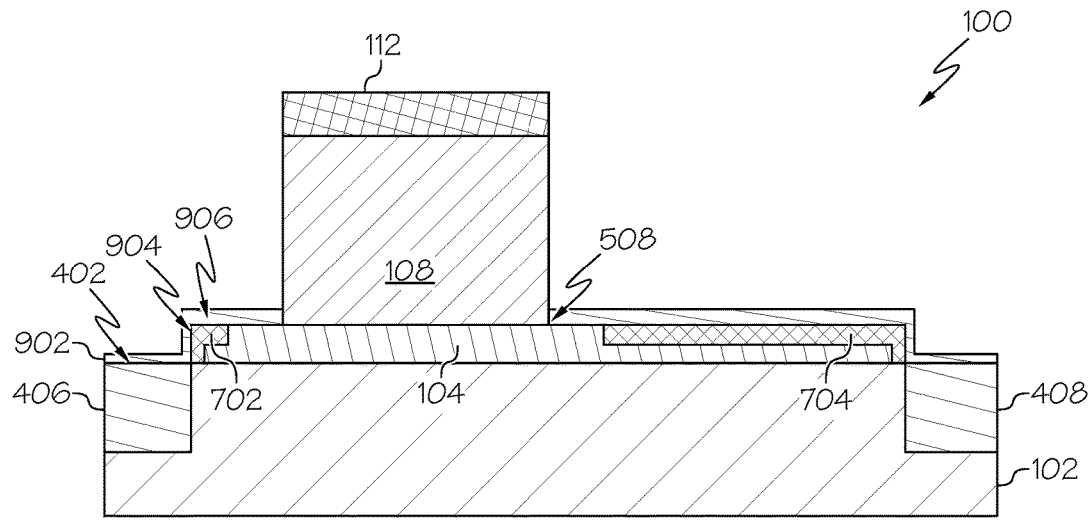

FIGS. 9A and 9B show that a bottom spacer layer 902 is then formed on the structure 100. The bottom spacer 902 is formed on and contacts the top surface 402 of the STI regions 402, 404, 406, 408; sidewalls 904 of the silicide regions 702, 704; the top surface 906 of the silicide regions 702, 704; a portion of the top surface 506 of the bottom source/drain layer 104; and a portion of the fin sidewalls 508. The bottom spacer 902 contacts the top surface 502 of STI regions 402, 404 and the top surface 504 of the bottom source/drain layer 104. In one embodiment, the bottom spacer 902 includes an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structures. In one embodiment, the spacers have a thickness of, for example, 3 nm to 30 nm.

Figure 10A:
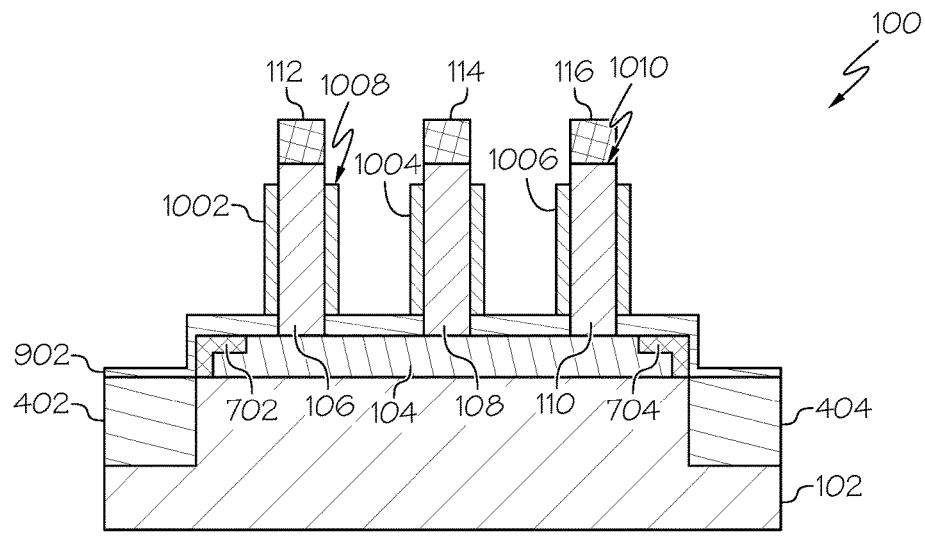
FIGS. 10A and 10B are cross-sectional views of the semiconductor structure after a metal gate layer and top spacer layer have been formed according to one embodiment of the present invention.
Figure 10B:
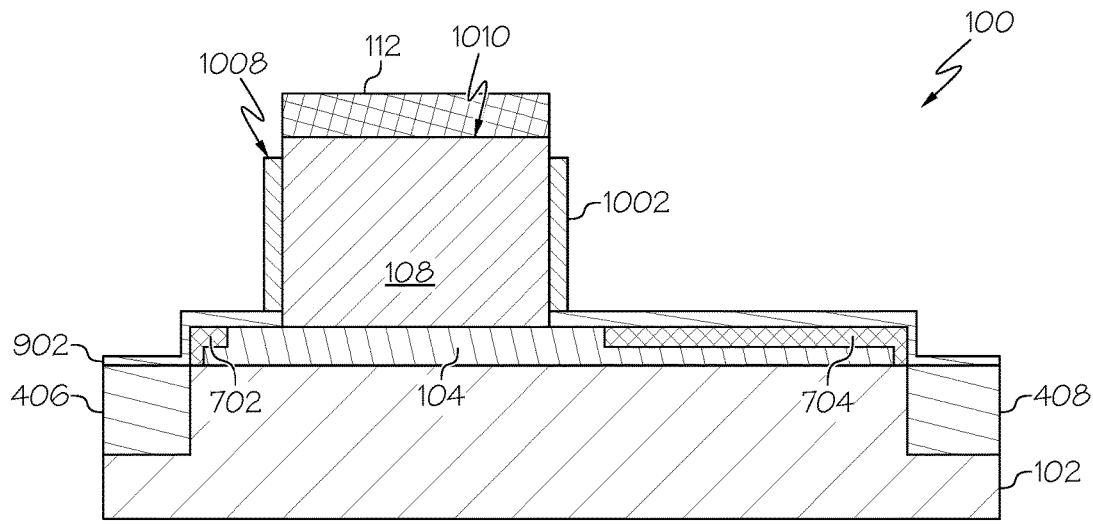

A high-k dielectric material is then blanket deposited over the entire structure 100, for example by CVD (chemical vapor deposition), PECVD (plasma enhanced chemical vapor deposition), or ALD (Atomic layer deposition). Excessive high-k gate dielectric material is removed, for example, by polishing such as chemically mechanical polishing (CMP) and/or etching to form high-k gate dielectric layers 1002, 1004, 1006 as shown in FIGS. 10A and 10B. Each of the high-k gate dielectric layers 1002, 1004, 1006 include a top surface 1008 that is below with a top surface 1010 of their respective fin 106, 108, 110. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layers 1002, 1004, 1006 can further include dopants such as lanthanum or aluminum.

In one embodiment, the high-k layers 1002, 1004, 1006 are part of a layer including a work function metal layer (not shown). In one embodiment, the work function metal layers are formed after and conformal to the high-k layers 1002, 1004, 1006 employing CVD, sputtering, or plating. The work function metal layers include one or more metals having a function suitable to tune the work function of nFETs or pFETs. Examples of first metals that can be employed in the work function metal layer include, but are not limited to La, Ti, and Ta. The thickness of the work function metal layers can be from 3 nm to 15 nm, although lesser and greater thicknesses can also be employed.

Figure 11A:
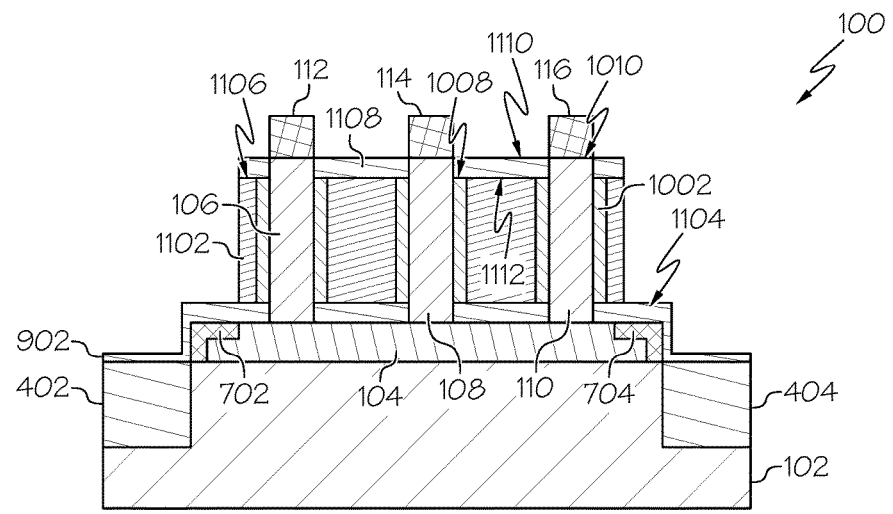
FIGS. 11A and 11B are cross-sectional views of the semiconductor structure after a top source/drain according to one embodiment of the present invention.
Figure 11B:
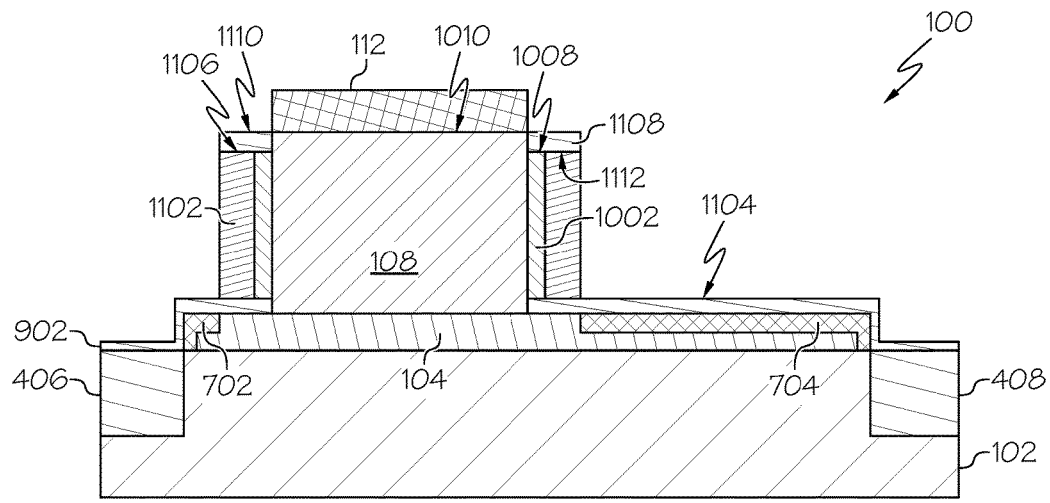

FIGS. 11A and 11B show that a metal gate 1102 is formed around the fins 106, 108, 110. For example, a metal gate material can be deposited by atomic layer deposition (ALD) or physical vapor deposition (PVD). In one embodiment, the metal gate 1102 is a continuous metal gate that wraps around all the fins 106, 108, 110. The metal gate 1102 contacts the outer sidewalls of the high-k gate dielectric layers 1002, 1004, 1006 and top surface 1104 of the bottom spacer 602. A top surface 1106 of the metal gate 1102 is co-planar with the top surface 1008 of the high-k dielectric layers 1002, 1004, 1006. In one embodiment, the metal gate 1102 includes, for example, tungsten.

FIGS. 11A and 11B further show that a top spacer layer 1108 is then formed on the structure 100. The top spacer layer 1108 includes a top surface 1110 that is co-planar with the top surface 1010 of the fins 106, 108, 110. The top spacer 1108 includes a bottom surface 1112 that contacts the top surface 1106 of the metal gate 1102, and the top surface 1008 of the high-k dielectric layers 1002, 1004, 1006. The top spacer layer 1108 also contacts the portion of the fin sidewalls 508 that are above the high-k dielectric layers 1002, 1004, 1006. In one embodiment, the top spacer 1108 includes the same or different material as the bottom spacers 902. For example, the top spacer 1108 can include an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structure.

Figure 12A:
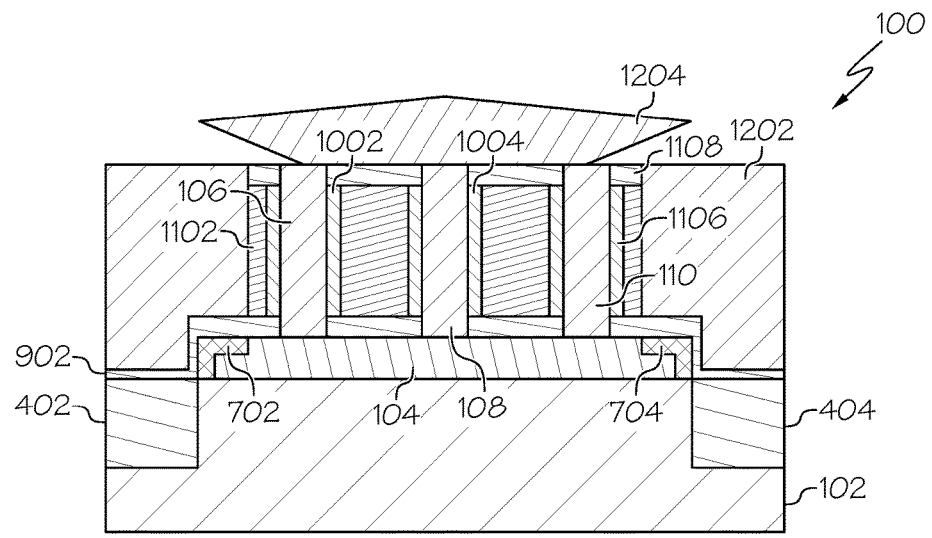
FIGS. 12A and 12B are cross-sectional views of the semiconductor structure after contacts have been formed according to one embodiment of the present invention.
Figure 12B:
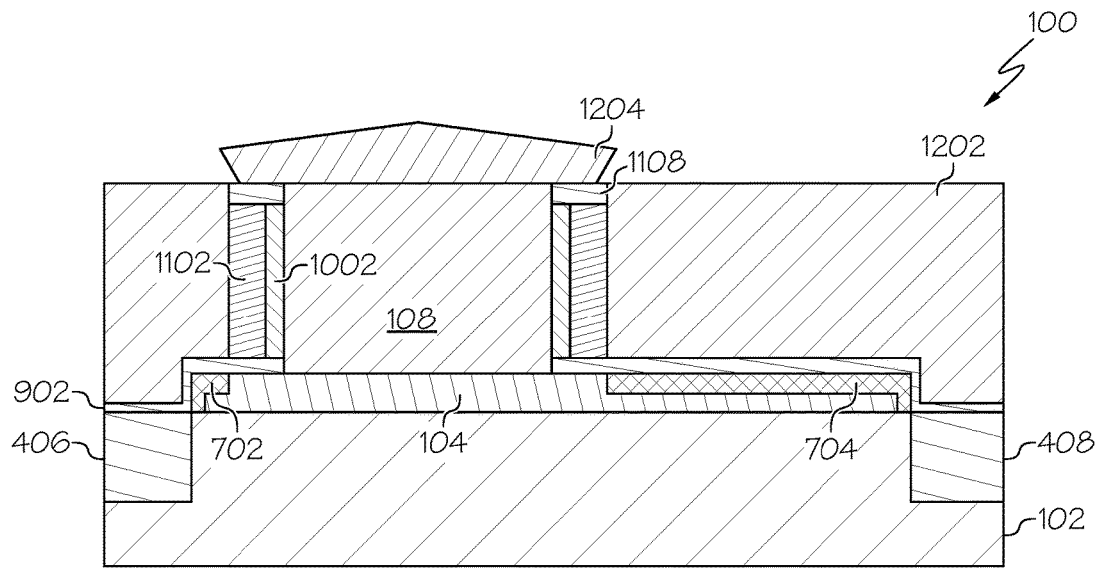

After the top spacer layer 1108 has been formed, an inter-layer dielectric (ILD) layer 1202 is deposited followed by chemical mechanical planarization (CMP) and etch-back, as shown in FIGS. 12A and 12B. The CMP process stops at top surface 1110 of the top spacer layer 1108 and the top surface 1010 of the fins 106, 108, 110. This process removes the etch-stop caps 112, 114, 116 of the fins 106, 108, 110. The interlayer dielectric 1202 can include SiO2, Si3N4, SiOxNy, SiC, SiCO, SiCOH, and SiCH compounds; one or more silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

FIGS. 12A and 12B also show that a doped layer 1204 (also referred to herein as "top source/drain layer 1204") is then formed using an epitaxy process. In one embodiment, the top source/drain layer 1204 has a "diamond-shaped/cross-section". The diamond-shaped/cross-sections top source/drain layer 1204 form due to the slower rate of growth of the silicon-containing material on the (111) surface of the 104, 106, 108. As such, the top source/drain layer 1204 has corresponding upper surfaces and lower surfaces. The lower surfaces face towards the semiconductor substrate 102 and the upper surfaces are positioned beyond the lower surfaces facing away from the semiconductor substrate 102. It should be noted that, in other embodiments, the top source/drain layer 1204 does not include a diamond-shaped/cross-section and has a planar configuration. In these embodiments, the top source/drain 1204 is formed on and in contact with each the fins 106, 108, 110 and the top spacer layer 1108. A bottom surface of the top source/drain layer 1204 contacts the top surface of the fins 106, 108, 110 and the top surface of the top spacer 1108. The top source/drain layer 1204 has a thickness in a range of, for example, about 10 nm to about 200 nm. However, other thicknesses are applicable as well. In any of the embodiment, the top source/drain layer 1204 can be formed by epitaxial growth.

Figure 13A:
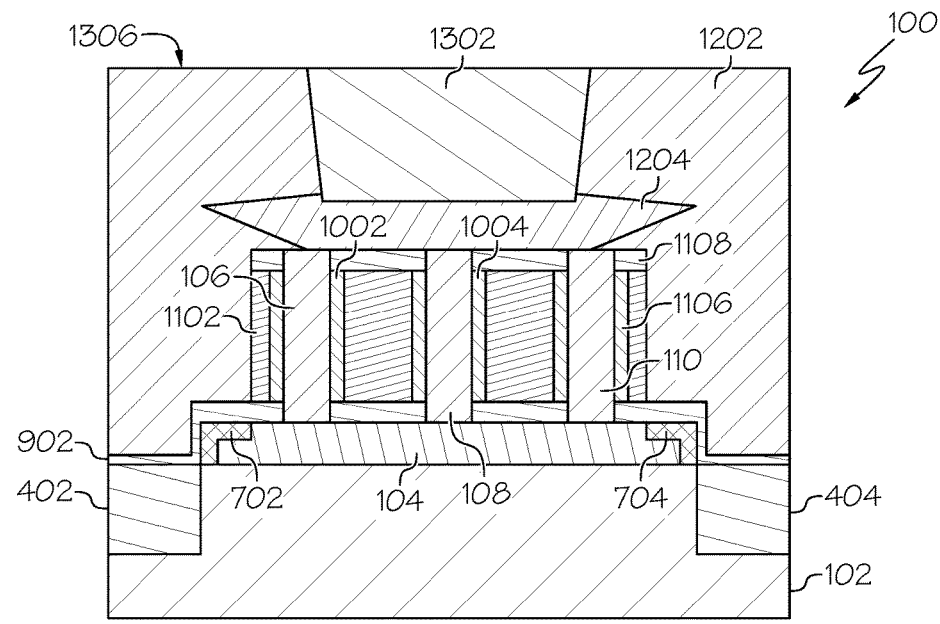
FIGS. 13A and 13B are cross-sectional views of the semiconductor structure after contacts has been formed according to one embodiment of the present invention.
Figure 13B:
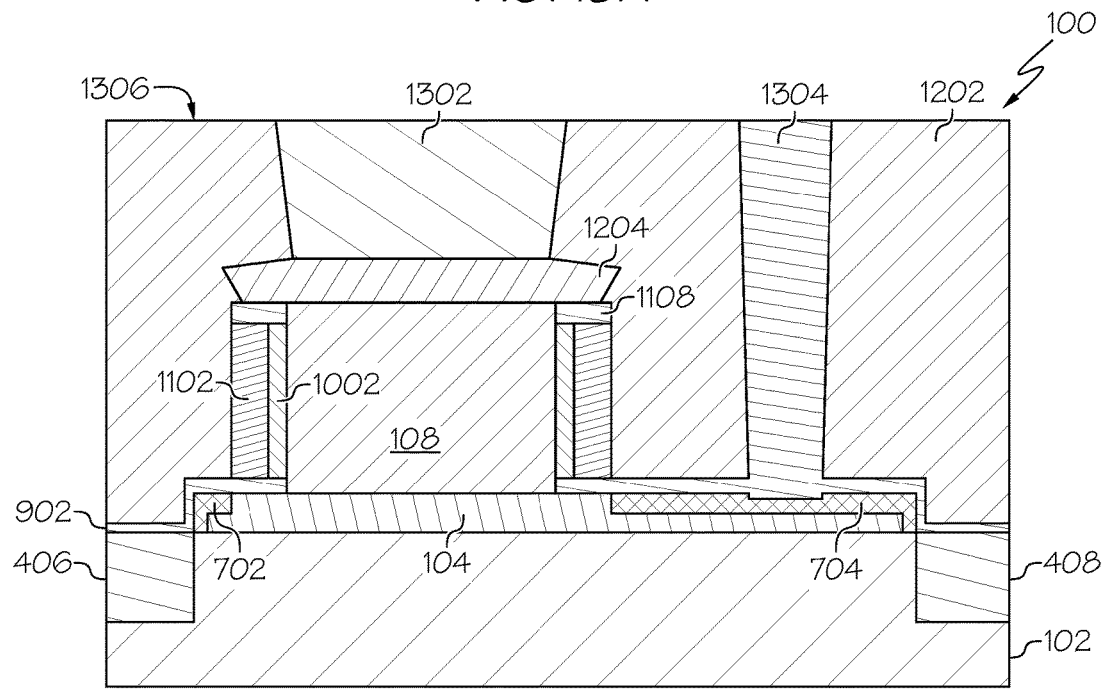

FIGS. 13A and 13B show that after the top source/drain layer 1204 has been formed, a first contact 1302 is formed above and in contact with the top source/drain layer 1204. A second contact 1304 is formed above and in contact with a portion of the silicide region 704 that is adjacent to an end of the fins 106, 108, 110. For example, an additional interlayer dielectric material is deposited over the structure 100 such that the interlayer dielectric 1202 include a top surface 1306 that extends above the top surface over the top source/drain layer 1204.

The dielectric layer 1202 is then patterned and etched to form a first via/trench down to and exposing the top source/drain layer 1204. The dielectric layer 1202 is also patterned and etched to form a second via/trench through the bottom spacer layer 902 exposing a portion of the silicide region 704. Conductive material is then deposited into the trenches to form the first and second contacts 1302, 1304. The contacts 1302, 1304 can be formed using a process such as CVD, PVD, ALD, or electroplating processes or some combination of these processes. The conductive metal can include, but is not limited to, tungsten, copper, aluminum, silver, gold and alloys thereof.

Figure 14:
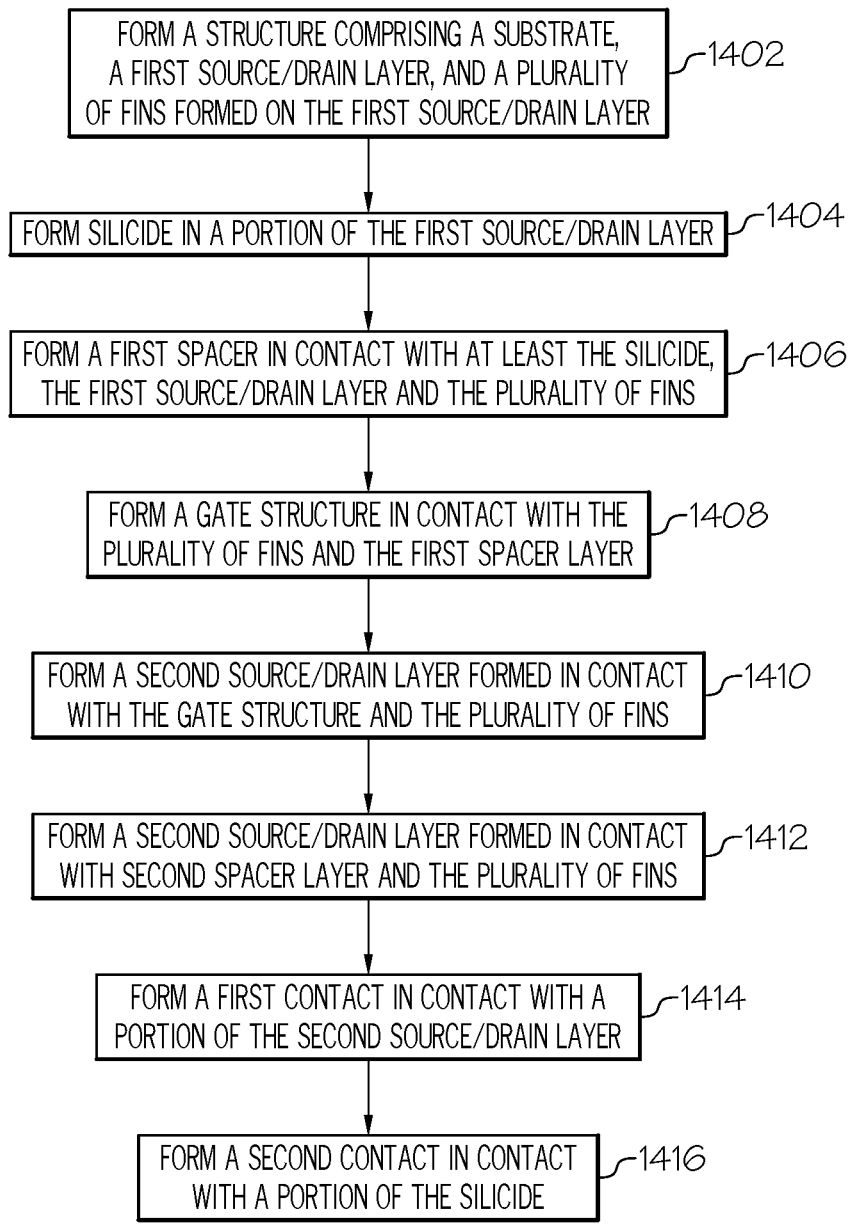
FIG. 14 is an operational flow diagram illustrating one process for fabricating vertical fin field-effect-transistor according to one embodiment of the present invention.

FIG. 14 is an operational flow diagram illustrating one process for fabricating a vertical fin field-effect-transistor. It should be noted that each of the steps shown in FIG. 14 has been discussed in detail above with respect to FIGS. 1-13. A structure, at step 1402, is formed. The structure comprises a substrate, a source/drain layer, isolation regions, and a plurality of fins disposed on and in contact with first source/drain layer. Silicide, at step 1404, is formed in a portion of the first source/drain layer. A first spacer layer, at step 1406, is formed in contact with at least the silicide, the first source/drain layer and the plurality of fins. A gate structure, at step 1408, is formed in contact with the plurality of fins and the first spacer layer. A second spacer layer, at step 1410, is formed in contact with the gate structure and the plurality of fins. A second source/drain layer, at step 1412, is formed in contact with second spacer layer and the plurality of fins. A first contact, at step, 1414, is formed in contact with a portion of the second source/drain layer. A second contact, at step 1416, is formed in contact with a portion of the silicide.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention can be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements can apply to some inventive features but not to others.

What is claimed is:

1. A vertical fin field-effect-transistor comprising at least:
   a substrate;
   a first source/drain layer;
   a plurality of fins each disposed on and in contact with the first source/drain layer;
   silicide regions disposed within a portion of the first source/drain layer including a portion of a top surface and surrounding the plurality of fins;
   a gate structure in contact with the plurality of fins; and
   a second source/drain layer disposed on the gate structure.

2. The vertical fin field-effect-transistor of claim 1, further comprising:
   at least one contact in contact with the second source/drain layer.

3. The vertical fin field-effect-transistor of claim 1, further comprising:
   at least one contact in contact with at least a portion of the silicide regions.

4. The vertical fin field-effect-transistor of claim 1, further comprising:
   a first spacer layer disposed in contact with at least the silicide, the first source/drain layer and the plurality of fins; and
   a second spacer layer in contact with the gate structure and the plurality of fins.

5. The vertical fin field-effect-transistor of claim 1, wherein the silicide regions contact the gate structure.

6. The vertical fin field-effect-transistor of claim 1, further comprising:
   isolation regions in contact with at least the substrate, the isolation regions comprising a top surface that is planar with a top surface of the substrate,
   wherein the silicide extends out to the isolation regions.

7. The vertical fin field-effect-transistor of claim 1, wherein the gate structure comprises:
   separate dielectric layers in contact with each fin in the plurality of fins; and
   a gate layer in contact with each of the separate dielectric layers.

8. The vertical fin field-effect-transistor of claim 7, wherein the gate structure further comprises:
   a separate work function layer formed on and in contact with each of the separate dielectric layers.

9. The vertical fin field-effect-transistor of claim 8, wherein the gate layer is formed on and in contact with each of the separate work function layers.

10. The vertical fin field-effect-transistor of claim 1, further comprising:
    a counter-doped layer formed on and in contact with the substrate.

11. An integrated circuit comprising:
    at least one vertical fin field-effect-transistor comprising at least:
    a substrate;
    a first source/drain layer;
    a plurality of fins each disposed on and in contact with the first source/drain layer;
    silicide regions disposed within a portion of the first source/drain layer and surrounding the plurality of fins, wherein the silicide regions extend at least from a top surface of the portion of the first source/drain layer down to a top surface of the substrate;
    a gate structure in contact with the plurality of fins, wherein at least a portion of the first source/drain layer underlying the gate structure is free of silicide; and
    a second source/drain layer disposed on the gate structure.

12. The integrated circuit of claim 11, wherein the vertical fin field-effect-transistor further comprises:
    at least one contact in contact with the second source/drain layer.

13. The integrated circuit of claim 11, wherein the vertical fin field-effect-transistor further comprises:
    at least one contact in contact with at least a portion of the silicide regions.

14. The integrated circuit of claim 11, wherein the vertical fin field-effect-transistor further comprises:
    a first spacer layer disposed in contact with at least the silicide, the first source/drain layer and the plurality of fins; and
    a second spacer layer in contact with the gate structure and the plurality of fins.

15. The integrated circuit of claim 11, wherein the silicide regions contact the gate structure.

16. The integrated circuit of claim 11, wherein the vertical fin field-effect-transistor further comprises:
    isolation regions in contact with at least the substrate, the isolation regions comprising a top surface that is planar with a top surface of the substrate,
    wherein the silicide extends out to the isolation regions.

17. The integrated circuit of claim 11, wherein the gate structure comprises:
    separate dielectric layers in contact with each fin in the plurality of fins; and
    a gate layer in contact with each of the separate dielectric layers.

18. The integrated circuit of claim 17, wherein the gate structure further comprises:
    a separate work function layer formed on and in contact with each of the separate dielectric layers.

19. The integrated circuit of claim 18, wherein the gate layer is formed on and in contact with each of the separate work function layers.

20. The integrated circuit of claim 11, wherein the vertical fin field-effect-transistor further comprises:
    a counter-doped layer formed on and in contact with the substrate.

* * * * *